United States Patent
Ma et al.

(10) Patent No.: US 11,755,082 B2
(45) Date of Patent: Sep. 12, 2023

(54) METHODS AND SYSTEMS FOR PROCESSOR-CALIBRATED FAN CONTROL

(71) Applicant: Dell Products, L.P., Round Rock, TX (US)

(72) Inventors: Yuan David Ma, Pflugerville, TX (US); Travis C. North, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 624 days.

(21) Appl. No.: 16/838,635

(22) Filed: Apr. 2, 2020

(65) Prior Publication Data

US 2021/0311535 A1 Oct. 7, 2021

(51) Int. Cl.
*H05K 7/20* (2006.01)
*G06F 1/20* (2006.01)
*F04D 25/16* (2006.01)
*F04D 27/00* (2006.01)
*F04D 29/58* (2006.01)

(52) U.S. Cl.
CPC ............ *G06F 1/206* (2013.01); *F04D 25/166* (2013.01); *F04D 27/004* (2013.01); *F04D 29/582* (2013.01); *H05K 7/20172* (2013.01); *H05K 7/20209* (2013.01); *F05D 2270/303* (2013.01); *F05D 2270/3061* (2013.01); *Y02B 30/70* (2013.01); *Y02D 10/00* (2018.01)

(58) Field of Classification Search
CPC ...... G06F 1/206; F04D 27/001; F04D 27/004; H05K 7/20172; H05K 7/20209; H05K 7/20136; H05K 7/20563; H05K 7/207; H05K 7/20836
See application file for complete search history.

(56) References Cited

U.S. PATENT DOCUMENTS

| | | | |
|---|---|---|---|
| 2013/0197895 A1* | 8/2013 | Wang | G06F 1/3203 703/21 |
| 2014/0068293 A1* | 3/2014 | Man | G06F 1/3206 713/320 |
| 2014/0139165 A1* | 5/2014 | Chen | G05D 23/1919 318/471 |
| 2014/0277818 A1* | 9/2014 | Peterson | G06F 1/206 700/300 |

(Continued)

*Primary Examiner* — Travis Ruby
(74) *Attorney, Agent, or Firm* — Fogarty LLP (57) ABSTRACT

In IHSs (Information Handling Systems), cooling is provided by increasing the airflow generated by cooling fans. However, unnecessary airflow cooling results in noise and wasted energy. An IHS processor may support faster operating frequencies when cooled below an upper threshold, but these operating frequencies drop at temperatures below a lower threshold. Embodiments provide techniques for calibrating the cooling of an IHS to the thermal characteristics of a specific processor since manufacturing variances result in processors having differing responses to cooling. A turbo frequency supported by a processor is measured at a series of temperature margins that are progressively lower than the processor's specification temperature. A rate of increase in the measured turbo frequencies is determined at each of the temperature margins. A first temperature margin is identified at which the rate of increase in turbo frequencies falls below a threshold. This margin is used in providing airflow cooling.

20 Claims, 4 Drawing Sheets

(56) References Cited

U.S. PATENT DOCUMENTS

| | | | | |
|---|---|---|---|---|
| 2014/0358288 | A1* | 12/2014 | Huang | H05K 7/20209 |
| | | | | 700/275 |
| 2019/0041925 | A1* | 2/2019 | Ahuja | G06F 1/324 |
| 2019/0313552 | A1* | 10/2019 | Curtis | H05K 7/20836 |
| 2021/0149464 | A1* | 5/2021 | Huang | G05B 15/02 |

* cited by examiner

METHODS AND SYSTEMS FOR PROCESSOR-CALIBRATED FAN CONTROL

FIELD

This disclosure relates generally to cooling internal components of an Information Handling System (IHS), and more specifically, to airflow cooling within an IHS.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Components of an IHS consume electrical power and can generate significant amounts of heat. Heat within an IHS may degrade the reliability and performance of various internal components of the IHS, possibly resulting in costly malfunctions and component failures. In order to circulate heated air away from internal components, an IHS may utilize a cooling fan to ventilate heated air from inside the IHS. As temperatures within the IHS increase, the speed of a cooling fan may be increased in order to ventilate additional heated air from within the IHS, or from within certain internal compartments of the IHS. Certain IHSs may utilize a single cooling fan to ventilate heated air from within the IHS. Other IHSs may utilize airflow cooling systems that include multiple cooling fans and a fan controller that monitors and controls the operation of the cooling fans.

Typically, high-power operations by an IHS result in increased levels of generated heat that must be ventilated from within the IHS. Providing additional cooling in order to support high-power operations may be accomplished by increasing the airflow velocity generated by the cooling fans, thus resulting in increased energy consumption and increased noise by the cooling system. For some personal computing IHSs, such as laptop computers, users prefer that cooling system noise remain at levels that are not perceived to be distracting. In data center environments that may include numerous airflow cooling systems, any unnecessary airflow cooling can result in significant levels of unnecessary energy use.

SUMMARY

In various embodiments, methods are provided for supporting airflow cooling in an IHS comprising a first processor. The methods may include: measuring a turbo frequency supported by the first processor at each of a series of temperature margins that are progressively lower than a specification temperature of the first processor; determining a rate of increase in the measured turbo frequencies at each of the temperature margins of the series; identifying a first temperature margin of the series at which the rate of increase in the supported turbo frequencies falls below a first threshold; and utilizing the first temperature margin in providing airflow cooling to the first processor.

In additional method embodiments, the specification temperature comprises a maximum operating temperature of the first processor. In additional method embodiments, the first threshold comprises an increase in the supported turbo frequencies per degree of cooling below the specification temperature of the first processor. In additional method embodiments, the first processor supports increasingly higher turbo frequencies when cooled below the specification temperature and wherein the first processor supports increasingly lower turbo frequencies when cooled below a lower threshold temperature. In additional embodiments, methods may include selecting the first threshold for the rate of increase in the supported turbo frequencies based on input by an administrator of the IHS specifying at least one of: a noise preference and a performance preference. In additional method embodiments, the input by the administrator specifies a preference for maximum turbo performance of the first processor. In additional method embodiments, the input specifying a preference for maximum turbo performance results in selection of the first threshold for the rate of increase in the supported turbo frequencies of approximately 1 MHz per degree of cooling below the specification temperature of the first processor.

In various additional embodiments, IHSs (Information Handling Systems) may include: a first processor; a plurality of cooling fans; an airflow controller comprising a memory device having instructions stored thereon that, upon execution by a logic unit, cause the airflow controller to: measure a turbo frequency supported by the first processor at each of a series of temperature margins that are progressively lower than a specification temperature of the first processor; determine a rate of increase in the measured turbo frequencies at each of the temperature margins of the series; identify a first temperature margin of the series at which the rate of increase in the supported turbo frequencies falls below a first threshold; and utilize the first temperature margin in providing airflow cooling to the first processor using the plurality of cooling fans.

In additional IHS embodiments, the specification temperature comprises a maximum operating temperature of the first processor. In additional IHS embodiments, the first threshold comprises an increase in the supported turbo frequencies per degree of cooling below the specification temperature of the first processor. In additional IHS embodiments, the first processor supports increasingly higher turbo frequencies when cooled below the specification temperature and wherein the first processor supports increasingly lower turbo frequencies when cooled below a lower threshold temperature. In additional embodiments, that memory device further includes instructions that, upon execution by the logic unit, cause the airflow controller to: select the first threshold for the rate of increase in the supported turbo frequencies based on input by an administrator of the IHS specifying at least one of: a noise preference and a performance preference. In additional IHS embodiments, the input by the administrator specifies a preference for maximum turbo performance of the first processor. In additional IHS embodiments, the input specifying a preference for maximum turbo performance results in selection of the first threshold for the rate of increase in the supported turbo frequencies of approximately 1 MHz per degree of cooling below the specification temperature of the first processor.

In various additional embodiments, computer-readable storage devices may include instructions stored thereon for providing airflow cooling via a plurality of cooling fans in an IHS (Information Handling System) comprising a first processor. Execution of the instructions by the one or more processors causes the one or more processors to: measure a turbo frequency supported by the first processor at each of a series of temperature margins that are progressively lower than a specification temperature of the first processor; determine a rate of increase in the measured turbo frequencies at each of the temperature margins of the series; identify a first temperature margin of the series at which the rate of change in the supported turbo frequencies falls below a first threshold; and utilize the first temperature margin in providing airflow cooling to the first processor using the plurality of cooling fans.

In additional storage device embodiments, the specification temperature comprises a maximum operating temperature of the first processor. In additional storage device embodiments, the first threshold comprises a change in the supported turbo frequencies per degree of cooling below the specification temperature of the first processor. In additional storage device embodiments, the first processor supports increasingly higher turbo frequencies when cooled below the specification temperature and wherein the first processor supports increasingly lower turbo frequencies when cooled below a lower threshold temperature. In additional storage device embodiments, that storage device further includes instructions that, upon execution, cause the first processor to select the first threshold for the rate of change in the supported turbo frequencies based on input by an administrator of the IHS specifying at least one of: a noise preference and a performance preference. In additional storage device embodiments, the input by the administrator specifies a preference for maximum turbo performance of the first processor.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 1:
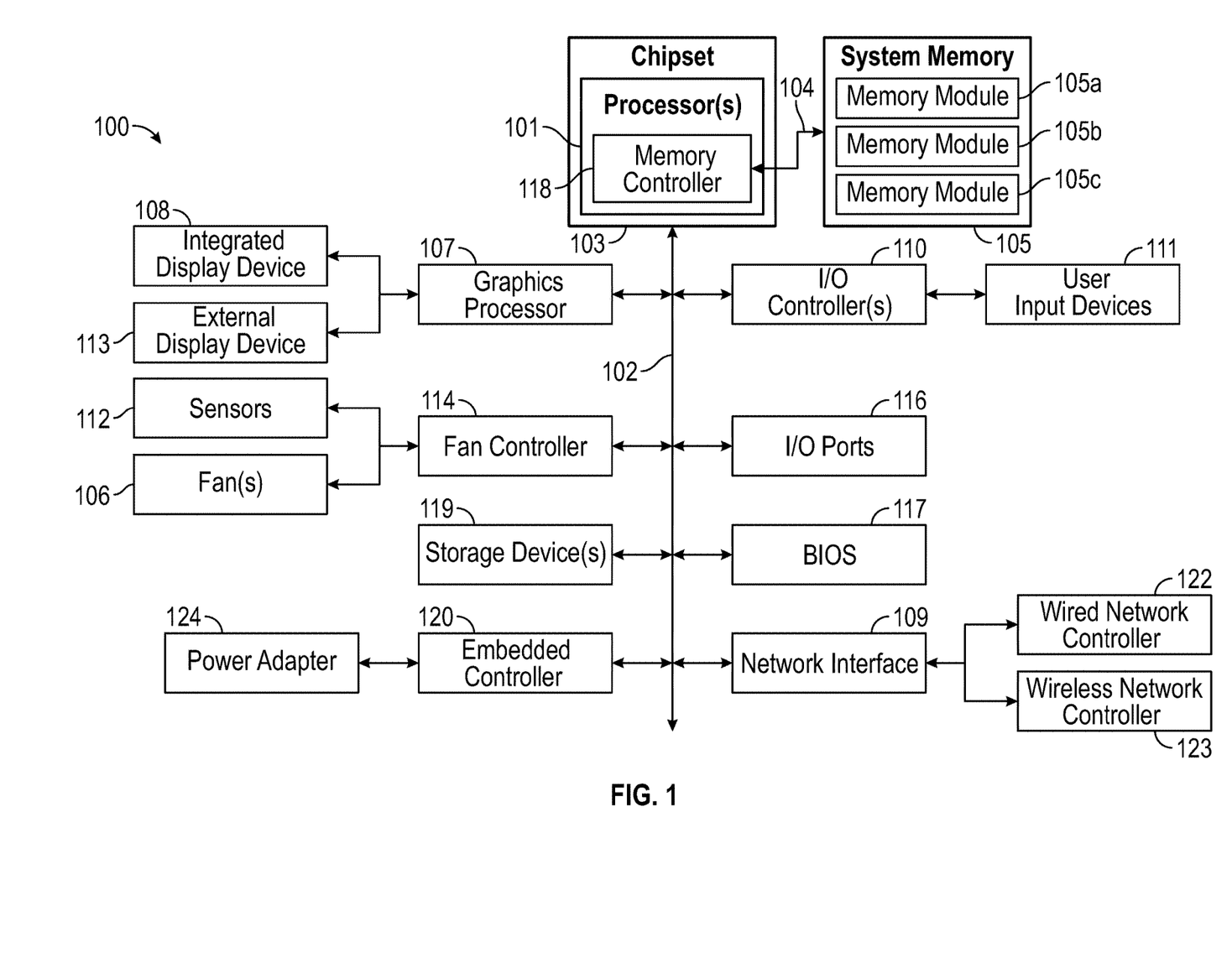
FIG. 1 is a block diagram depicting certain components of an IHS configured according to various embodiments for control of an airflow cooling system using temperature margins that are calibrated to the thermal characteristics of the processor(s) of the IHS.

FIG. 1 shows an example of an IHS configured to implement the systems and methods described herein. It should be appreciated that although certain IHS embodiments described herein may be discussed in the context of a personal computing device, other embodiments may be utilized.

FIG. 1 is a block diagram illustrating certain components of an IHS 100 configured according to certain embodiments for control of an airflow cooling system using temperature margins that are calibrated to the thermal characteristics of the processor(s) 101 of the IHS 100. As described in additional detail below, IHS 100 may include a fan controller 114 and/or an embedded controller 120 that may execute program instructions that perform certain of the operations disclosed herein for calibrating and controlling the airflow cooling generated by one or more cooling fans 106 of IHS 100.

IHS 100 includes one or more processors 101, such as a Central Processing Unit (CPU), that execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs). As processor 101 operates at faster speeds (i.e., at higher clock frequencies), it will typically generate more heat that is dissipated at least in part via the operation of cooling fans 106. In many instances, processor 101 may be limited to operating below a rated frequency during normal operating conditions. However, processor 101 may be capable of operating at speeds greater than this rated frequency, such as to support certain high-power operations and in support of temporary spikes in the load on processor 101. In some instances, such temporary increases in operating frequency above the rated frequency of processor 101 may be referred to as turbo and/or boost operations. The capability of a processor 101 to provide turbo boosts in processing speed may be limited based on the temperature at which the processor 101 is operating. In many instances, the specification of processor 101 may specify a maximum operating temperature (i.e., the processor's specification temperature or "spec" temperature) for the processor, where this spec temperature may be provided by the manufacturer of processor 101. In maintaining the temperature of processor 101 below this spec temperature, the operating temperature of the processor 101 may be determined directly or indirectly using temperature measurements by one or more sensors 112.

As described in additional detail below, processor 101 may support turbo frequencies for operating temperatures that are below the spec temperature of the processor 101, with higher turbo frequencies supported the further below the spec temperature processor 101 is cooled. Accordingly, by providing additional airflow cooling of processor 101, lower operating temperatures may be achieved, thus supporting higher turbo frequencies. The higher turbo frequencies that are supported by providing additional cooling are limited, however, by lower operating efficiencies of the transistors that comprise processor 101 at operating temperatures that are below a certain threshold. As described in additional detail below, cooling processor 101 below this threshold temperature results in unnecessary airflow cooling that no longer supports faster turbo frequencies of processor 101. Determining this lower threshold temperature for operation of processor 101 is complicated by the fact that manufacturing variances result in individual processors having differing transistor efficiency characteristics. Additional cooling of processor 101 may support increasingly faster turbo speeds until the temperature of processor 101 drops below this lower threshold temperature, but a different processor of the same variety as processor 101 may have a lower threshold temperature that varies by several degrees from the lower threshold temperature of processor 101. As described in additional detail below, embodiments identify this lower threshold operating temperature for a specific processor based on its particular thermal characteristics. Embodiments utilize this lower threshold temperature that is identified for a particular processor 101 for calibrating the operation of cooling fans 106 to the specific thermal characteristics of processor 101.

In the embodiment of FIG. 1, the processor 101 includes an integrated memory controller 118 that may be implemented directly within the circuitry of the processor 101, or the memory controller 118 may be a separate integrated circuit that is located on the same die as the processor 101. The memory controller 118 may be configured to manage the transfer of data to and from the system memory 105 of the IHS 100 via a high-speed memory interface 104. The system memory 105 that is coupled to processor 101 provides the processor 101 with a high-speed memory that may be used in the execution of computer program instructions by the processor 101. Accordingly, system memory 105 may include memory components, such as such as static RAM (SRAM), dynamic RAM (DRAM), NAND Flash memory, suitable for supporting high-speed memory operations by the processor 101. In certain embodiments, system memory 105 may combine both persistent, non-volatile memory and volatile memory. In certain embodiments, the system memory 105 may be comprised of multiple removable memory modules.

IHS 100 utilizes a chipset 103 that may include one or more integrated circuits that are connect to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of separate buses to provide the illustrated pathways served by bus 102.

In various embodiments, IHS 100 may include one or more I/O ports 116 that may support removeable couplings with various types of external devices and systems, including removeable couplings with peripheral devices that may be configured for operation by a particular user of IHS 100. For instance, I/O 116 ports may include USB (Universal Serial Bus) ports, by which a variety of external devices may be coupled to IHS 100. In addition to or instead of USB ports, I/O ports 116 may include various types of physical I/O ports that are accessible to a user via the enclosure of the IHS 100. As described in additional detail below, in various embodiments, configurable aspects of peripheral devices that are coupled to IHS 100 via I/O ports 116 may be managed based on the context of the user's operation of IHS 100 and any similarly configured IHSs.

In certain embodiments, chipset 103 may additionally utilize one or more I/O controllers 110 that may each support the operation of hardware components such as user I/O devices 111 that may include peripheral components that are physically coupled to an I/O port 116 and/or peripheral components that are wirelessly coupled to IHS 100 via a network interface 109. In various embodiments, I/O controller 110 may support the operation of one or more user I/O devices 110 such as a keyboard, mouse, touchpad, touchscreen, microphone, speakers, camera and other input and output devices that may be coupled to IHS 100. As described, user I/O devices 111 may interface with an I/O controller 110 through wired or wireless couplings supported by IHS 100.

As described, IHS 100 may support one or more of network interfaces 109 that may support different types of network connectivity. In certain embodiments, IHS 100 may include one or more Network Interface Controllers (NICs) 122, 123, each of which may implement the hardware required for communicating via a specific networking technology, such as W-Fi, BLUETOOTH, Ethernet and mobile cellular networks (e.g., CDMA, TDMA, LTE). As illustrated, network interface 109 may support network connections by wired network controllers 122 and wireless network controllers 123. Each network controller 122, 123 may be coupled via various buses to the chipset 103 of IHS 100 in supporting different types of network connectivity, such as the network connectivity utilized by the operating system of IHS 100. In certain embodiments, such network connectivity may support configuration of IHS 100 as a member of an enterprise network by which a variety of computing services may be provided to a user of IHS 100.

Chipset 103 may also provide access to one or more display device(s) 108, 113 via graphics processor 107. In certain embodiments, graphics processor 107 may be comprised within a video card, graphics card or within an embedded controller installed within IHS 100. In certain embodiments, graphics processor 107 may be integrated within processor 101, such as a component of a system-on-chip. Graphics processor 107 may generate display information and provide the generated information to one or more display device(s) 108, 113 coupled to the IHS 100. The one or more display devices 108, 113 coupled to IHS 100 may utilize LCD, LED, OLED, or other display technologies. Each display device 108, 113 may be capable of receiving touch inputs such as via a touch controller that may be an embedded component of the display device 108, 113 or graphics processor 107, or may be a separate component of IHS 100 accessed via bus 102. In some embodiments, power to graphics processor 107, integrated display device 108 and/or external display 133 may be turned off, or configured to operate at minimal power levels, in response to IHS 100 entering a low-power state.

Chipset 103 also provides processor 101 with access to one or more storage devices 119. In various embodiments, a storage device 119 may be integral to the IHS 100 or may be external to the IHS 100. In certain embodiments, storage device 119 may be accessed via a storage controller that may be an integral component of the storage device. Storage device 119 may be implemented using any memory technology allowing IHS 100 to store and retrieve data. For instance, storage device 119 may be a magnetic hard disk storage drive or a solid-state storage drive. In certain embodiments, storage device 119 may be a system of storage devices, such as a cloud system or enterprise data management system that is accessible via network interface 109.

As illustrated, IHS 100 also includes a BIOS (Basic Input/Output System) 117 that may be stored in a non-volatile memory accessible by chipset 103 via bus 102. The BIOS 117 provides an abstraction layer that allows the operating system to interface with the hardware components of the IHS 100. Upon powering or restarting IHS 100, processor(s) 101 may utilize BIOS 117 instructions to initialize and test hardware components coupled to the IHS 100, including both components permanently installed as components of the motherboard of IHS 100 and removable components installed within the various expansion slots supported by the IHS 100. The BIOS 117 instructions may also load an operating system for use by the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. In certain embodiments, the BIOS may be replaced, in full or in part, by a baseboard management controller (BMC) or another in-band or out-of-band controller that supports remote administration of IHS 100. In certain embodiments, the initialization of IHS 100 by BIOS 117 may be paused to allow for the validation of instructions utilized by a trusted component, such as by a secure processor, in order to establish a hardware root of trust in the trusted component that may then be utilized to support certain secure operations of IHS 100.

In the illustrated embodiment, IHS 100 includes a fan controller 114 that may be used to operate an airflow cooling system that may include one or more cooling fans 106. In certain embodiments, fan controller 114 may be include a processor or other logic unit and a memory for storage of firmware instructions used in the operation of the fan controller 114 as described herein. In other embodiments, fan controller 114 may be implemented as a system-on-chip function of a processor 101 of IHS 100, or may be implemented by another controller, such as embedded controller 120. The fan controller 114 may be configured to interoperate with one or more sensors 112 in order to monitor temperature conditions at internal locations within the IHS 100, such as a core temperatures and junction temperatures collected by sensors 112 located in proximity to processor 101. Based on temperature measurements collected by sensors 112, the fan controller 114 may activate or increase the speed of cooling fans in order to ventilate heated air from within the IHS 100. In some embodiments, fan controller 114 may utilize a fan speed table to determine speeds for one or more fans 106 that will provide sufficient airflow for operating at or below a specific core temperature. In some embodiments, this fan table used by fan controller 114 may also specify a temperature margin to be maintained by the airflow cooling system, where this temperature margin is the margin between the current operating temperature of processor 101 and the spec temperature of processor 101. As described, processor 101 may support higher turbo frequencies when operating at increased temperature margins, where this support for higher turbo frequencies is attenuated by temperature margins that result in temperature of processor 101 below a lower temperature threshold at which operating efficiencies of processor 101 begin to decline.

As illustrated, IHS 100 embodiments may utilize an embedded controller 120 that may be a motherboard component of IHS 100 and may include one or more logic units. In certain embodiments, embedded controller 120 may operate from a separate power plane from the main processors 101 of IHS 100, and thus also separate from the operating system functions of IHS 100. Firmware instructions utilized by embedded controller 120 may be used to operate a secure execution environment that may include operations for providing various core functions of IHS 100, such as for power management, via a power adapter 124, and for certain remote management functions.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2:
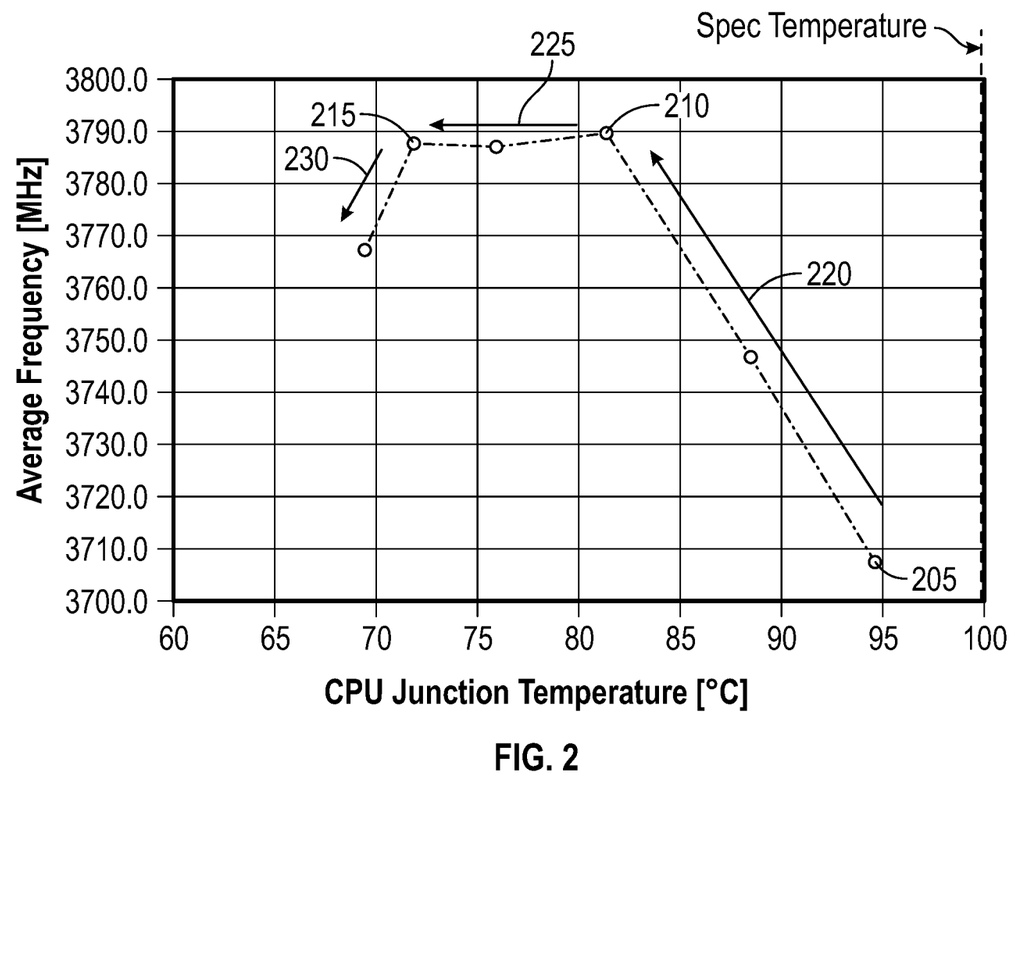
FIG. 2 is a graph illustrating the relationship between maximum supported turbo processor frequencies and processor temperatures.

FIG. 2 is a graph illustrating the relationship between maximum turbo frequencies supported by a processor and processor temperatures. As described, a processor may be assigned a rated frequency by its manufacturer, where this frequency is the upper limit of the processor's operating speed under normal processing loads. In some instances, this rated frequency may be referred to as the spec frequency of processor. Also as described, processors may exceed this spec frequency for limited durations in order to accommodate for spikes in processing loads. These turbo frequencies supported by processors may be typically utilized only if the temperature of the processor remains below an upper threshold temperature. This upper threshold temperature may be specified by the processor's manufacturer and may be referred to as the spec temperature of the processor. While the temperature of a processor remains below this spec temperature, the processor may support turbo frequencies above its spec frequency. FIG. 2 illustrates the capability of certain processors to support various turbo frequencies when the processor is operating below its spec temperature.

In the example of FIG. 2, the spec temperature of the processor is 100 degrees Celsius. The data point at 205 illustrates the turbo frequency of approximately 3710 MHz that is supported by the processor when it is cooled to approximately 95 degrees Celsius, thus providing a 5 degree temperature margin from the processor's spec temperature. As illustrated, when the temperature margin is increased above 10 degrees to an approximate operating temperature of 88 degrees Celsius, the turbo frequency supported by the processor increases to approximately 3745 MHz. This general increase in supported turbo frequencies continues along a trajectory 220 as the temperature margin from the spec temperature is increased further. This trajectory 220 continues until reaching point 210 where the processor is cooled to approximately 82 degrees Celsius, resulting in the processor supporting a turbo frequency of 3790 MHz.

As illustrated, the trajectory 220 of increasing turbo frequencies does not continue unabated. As the temperature margin is increased further to approximately 76 degrees, the maximum turbo frequency supported by the processor does not increase further. Additional cooling of the processor to approximately 72 degrees, at point 215, again does not result in any further increase in the turbo frequency supported by the processor. This plateau in supported turbo frequencies is illustrated by trajectory 225. As described, the transistors that comprise a processor are designed for operation within a defined temperature range, with the spec temperature of the processor representing an upper bound on this temperature range. When a processor is cooled below the lower bound of this temperature range, the efficiency of these transistors begins to decrease such that the processor is no longer capable of supporting higher turbo frequencies in response to additional cooling.

This decrease in operating efficiency of the transistors that comprise a processor is illustrated by the trajectory 230 of the supported turbo frequencies when a processor is cooled below its lower threshold of efficient operating temperatures. When further cooling lowers the operating temperature of the processor below 70 degrees Celsius, the turbo frequency supported by the processor drops below 3770 MHz. Along trajectory 230, the efficiency of the transistors begins to deteriorate further, thus resulting in supported turbo speeds decreasing at these lower operating temperatures. Accordingly, cooling the processor past the temperature margin at point 210 no longer results in increased turbo speeds and cooling the processor past the temperature margin of point 215 actually results in decreasing maximum turbo frequencies. Cooling the processor past the temperature margin of point 210 thus results in unnecessary airflow cooling, which wastes energy and generates unnecessary noise.

Determining the maxima in this relationship between the cooling margin and supported turbo frequencies is complicated by the fact that individual processors may have different maxima due to manufacturing variances, even if the processors are of the same type and are otherwise indistinguishable. Embodiments provide a capability for identifying such a maxima in the turbo frequencies supported by a particular processor, as well as determining an optimal cooling margin for supporting this maximum turbo frequency. Once this optimal cooling margin has been identified for a particular processor, the cooling system may be calibrated to support the maximum turbo frequency of the processer, while minimizing unnecessary airflow cooling.

Figure 3:
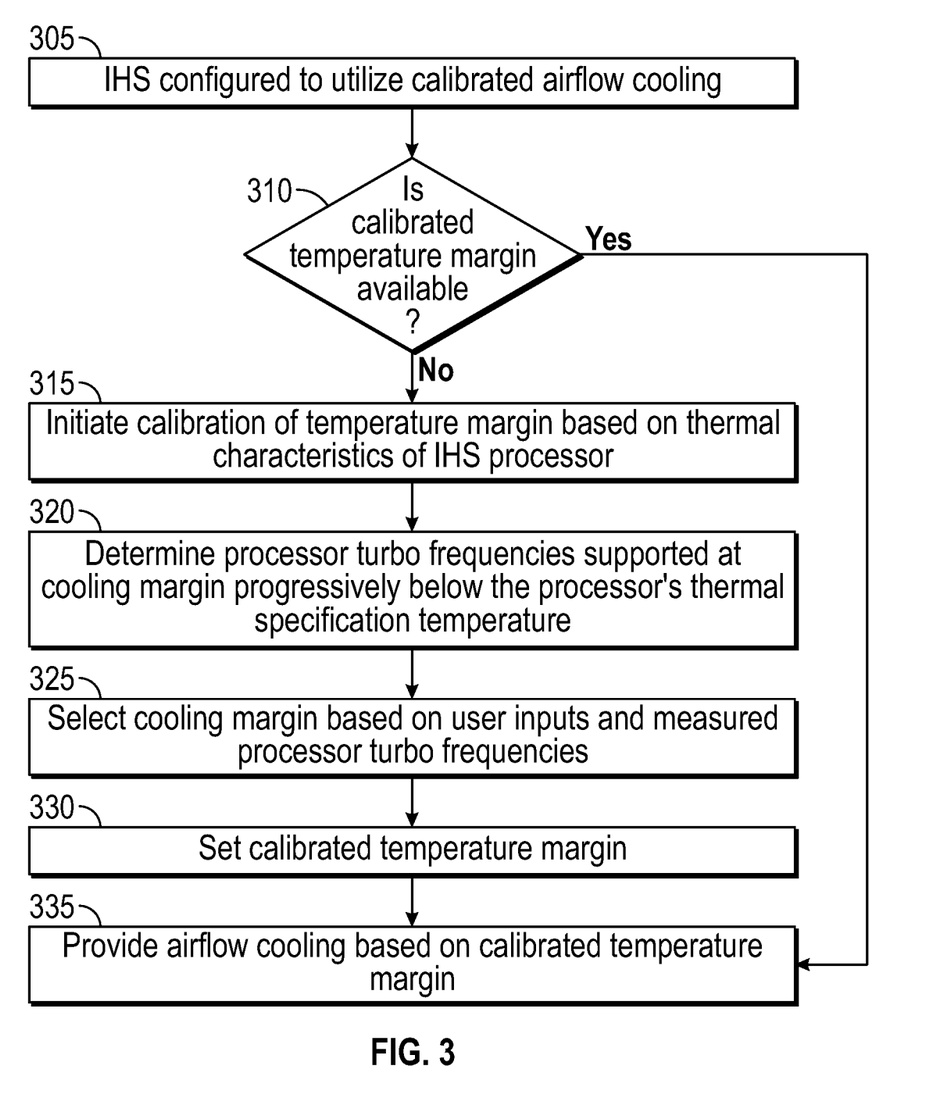
FIG. 3 is a flow chart illustrating certain aspects of a process according to embodiments for control of an airflow cooling system using temperature margins that are calibrated to the thermal characteristics of the processor(s) of an IHS.

FIG. 3 is a flow chart illustrating certain aspects of a process according to embodiments for control of an airflow cooling system of an IHS using temperature margins that are calibrated to the thermal characteristics of the processor(s) of the IHS. The illustrated embodiment begins at block 305 with the configuration of an IHS to maximize available turbo capabilities of a processor while utilizing airflow cooling that is calibrated to the thermal characteristics of the processor. In some embodiments, the configuration of an IHS for utilizing maximum turbo capabilities using calibrated airflow cooling may be through the manual selection of this option by a user, such as via a BIOS configuration or via a configuration available via the operating system of the IHS. In some embodiments, an IHS may be configured during manufacture for utilizing maximum turbo capabilities using calibrated airflow cooling. In some instances, the airflow cooling of an IHS may be calibrated to the thermal characteristics of a processor once during the lifetime of the IHS and, in other instances, the airflow cooling may be calibrated multiple times during the lifetime of an IHS as the thermal characteristics of the processor change over time.

Once an IHS has been configured to utilize calibrated airflow cooling, at block 310, the availability of a calibrated temperature margin is determined. If no such calibrated temperature margin is available, at block 315, the calibration process is initiated. If a calibrated temperature margin has been previously determined and is available for use, at block 335, that temperature margin is used in providing airflow cooling. As described, a calibrated temperature margin may be selected based on evaluation of turbo capabilities of a processor determined at various different temperature margins. Through use of the calibrated temperature margin, the airflow cooling system provides sufficient airflow to cool the processor to this calibrated temperature margin, thus supporting the maximum available turbo frequency of the processor without the excess noise and wasted resources resulting from cooling the processor beyond this calibrated temperature margin.

Figure 4:
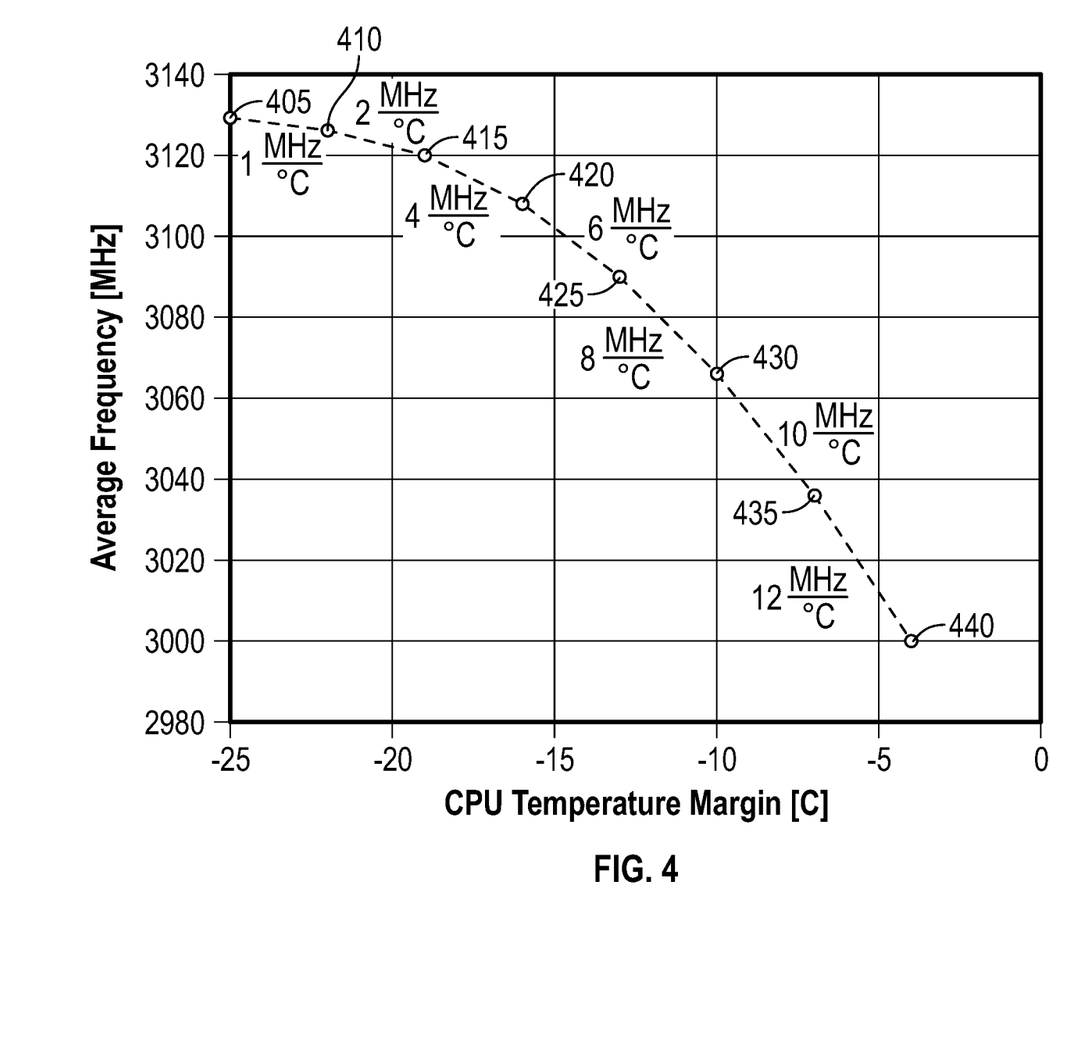
FIG. 4 is a graph illustrating rates of change in maximum turbo frequencies that are supported by a processor in response to reductions in temperature of the processor below its spec temperature.

If no calibrated temperature margin is available, at block 315, a calibration process is initiated. In some instances, the calibration process may be scheduled during a period of inactivity of the IHS, such as during overnight hours when the IHS is infrequently used. At block 320, the calibration process proceeds by measuring the maximum turbo frequencies that are supported by the processor when the processor has been cooled to various temperature margins below the spec temperature of the processor. FIG. 4 is a graph illustrating maximum turbo frequencies supported by a processor when subject to a constant load and cooled to various temperature margins below the processor's spec temperature. In some embodiments, the data points illustrated in FIG. 4 may be generated through a series of repeated trials that are used to determine an average maximum turbo frequency that is supported at a specific temperature margin. As such, measuring the maximum turbo frequency supported by a processor at a specific temperature margin may actually refer to an average turbo frequency that is supported at this temperature margin.

The calibration process may measure the maximum turbo frequency that is supported by a processor at each of a series of temperature margins that are progressively lower than the spec temperature of the processor. For instance, as illustrated at point 440 of FIG. 4, cooling a processor to 4 degrees below its spec temperature results in the processor supporting a maximum turbo frequency of 3000 MHz. As illustrated by point 435, cooling the processor to 7 degrees below its spec temperature results in an increase in the processor's maximum turbo frequency to approximately 3038 MHz. Cooling the processor further to 10 degrees below its spec temperature results, at point 430, in a maximum turbo frequency of approximately 3065 MHz. Further cooling of the processor to 13 degrees below its spec temperature, at point 425, results in a maximum turbo frequency of approximately 3090 MHz. Additional cooling of the processor to 16 degrees below its spec temperature, at point 420, results in a maximum turbo frequency of approximately 3114 MHz. At point 415, cooling of the processor to 19 degrees below its spec temperature results in a turbo frequency of approximately 3120 MHz. Cooling the processor further to 22 degrees below its spec temperature results, at point 410, in a maximum turbo frequency of approximately 3124 MHz. Finally, at point 405, cooling of the processor at 25 degrees below its spec temperature results in the processor supporting a maximum turbo frequency of 3130 MHz.

As evident from the data points included in FIG. 4, the additional cooling of the processor below its spec temperature provides diminishing returns with respect to the maximum turbo frequency supported by the processor. The graph of FIG. 4 includes labels that specify the approximate increase in turbo frequency resulting from the amount of additional cooling between the plotted data points. For example, cooling the processor from the 4 degree temperature margin of point 440 to the 7 degrees temperature margin of point 435 results in an increase in the maximum turbo frequency of 12 MHz for each degree of additional cooling that is provided. As illustrated, the additional cooling between points 435 and 430 results in an increase in the maximum turbo frequency of 10 MHz for each degree of cooling in the central. The cooling provided to reduce the temperature margin from point 430 to point 425 results in an 8 MHz increase in the maximum turbo frequency for each degree of cooling. The increase in the temperature margin between points 425 and 420 results in a 6 MHz increase in the maximum turbo frequency for each degree of cooling. Between points 420 and 415, the further reduction in the temperature margin results in a 4 MHz increase in the maximum turbo frequency for each degree of cooling. Further cooling to point 410 results in a further diminishing turbo frequency return with only a 2 MHz increase in the maximum turbo frequency for each degree of cooling. The increase in the maximum turbo frequency per degree of cooling drops to 1 MHz for further cooling to point 405.

Referring back to FIG. 3, at block 325, the data collected via the series of cooling iterations illustrated in FIG. 4 is evaluated to determine the optimal temperature margin for cooling an IHS based on the thermal characteristics of the processor of the IHS. In some embodiments, this optimal temperature margin is determined by evaluating the incremental increase in the maximum turbo frequency that results from each successive increase in the temperature margin. For instance, in the example of FIG. 4, the optimal temperature margin may be selected by determining when the rate of increase in the maximum supported turbo frequency drops below 2 MHz for each additional degree of applied cooling below the processor's spec temperature. Accordingly, with this minimum rate of increase in the supported turbo frequency set to 2 MHz, the optimal temperature margin is determined to be at point 410, at which a temperature margin of 22 degrees results in a maximum turbo frequency of approximately 3124 MHz. Additional cooling beyond this optimal temperature margin results in only marginal additional increases in the maximum turbo frequency, thus resulting in significant additional cooling resources being expended for little additional benefit. In this manner embodiments support use of various different thresholds for the minimum rate of increase in turbo frequencies that is used in determining optimal temperature margins for cooling an IHS. In certain scenarios where user's prefer limited amounts of addition cooling fan noise, a minimum rate of increase in turbo frequencies may be selected that requires a relatively large increase in turbo frequencies for each degree of additional cooling. For instance, users of certain portable IHSs may choose to limit turbo capabilities in order to conserver available battery power and/or to minimize cooling noise. Administrative configurations by or on behalf of such users may specify a preference for conserving energy and/or minimizing noise in exchange for limitations on high-end performance capabilities. In the example of FIG. 4, such configurations selections may correspond to a minimum rate of increase of 10 MHz and thus the use of the cooling margin of 10 degrees at point 430.

However, in other instances, users may prefer to maximize available turbo capabilities without regard to cooling resources or noise and may thus select a minimum rate of increase that requests any additional cooling that will result in any increase in turbo frequencies. For instance, in a data center, certain IHSs, such as blade servers, may be configured to support high-performance operations for which maximum turbo capabilities are preferred. In such instances, an administrator may configure these IHS to utilize calibrated airflow cooling, where this calibration determines the maximum turbo frequencies available, while also maximizing use of available cooling resources, but without unnecessary airflow cooling. A user of a personal IHS, such as desktop or laptop, may similarly administers these IHS to choose a preference for maximum turbo performance in order to support gaming, xR applications or other high-performance applications. In such instances, a minimum rate of increase of 1 MHz may be specified, resulting in the use of the 25 degree cooling margin of point 405.

In this manner, an optimal temperature margin may be identified and used for calibrating an airflow cooling system for the particular thermal characteristics of a specific processor. Through selection of a minimum rate of increase in turbo frequencies in response to additional cooling, an optimal temperature margin may be selected that is near the maxima in the relationship between temperature margins and supported turbo frequencies, such as described with regard to FIG. 2. At block 330 of FIG. 3, the minimum rate of increase in turbo frequencies is utilized for selecting the temperature margin that has been calibrated to the thermal responses that are particular to this processor. At block 335, the airflow cooling system operates using this calibrated temperature margin, thus providing airflow cooling that supports maximum supported turbo frequencies of a particular processor without wasting airflow cooling resources.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for supporting airflow cooling in an IHS (Information Handling System) comprising a first processor, the method comprising:
   measuring a turbo frequency supported by the first processor at each of a series of temperature margins that are progressively lower than a specification temperature of the first processor;
   determining a rate of increase in the measured turbo frequencies at each of the temperature margins of the series;
   identifying a first temperature margin of the series at which the rate of increase in the supported turbo frequencies falls below a first threshold; and
   utilizing the first temperature margin in providing airflow cooling to the first processor.

2. The method of claim 1, wherein the specification temperature comprises a maximum operating temperature of the first processor.

3. The method of claim 1, wherein the first threshold comprises an increase in the supported turbo frequencies per degree of cooling below the specification temperature of the first processor.

4. The method of claim 1, wherein the first processor supports increasingly higher turbo frequencies when cooled below the specification temperature and wherein the first processor supports increasingly lower turbo frequencies when cooled below a lower threshold temperature.

5. The method of claim 1, further comprising:
   selecting the first threshold for the rate of increase in the supported turbo frequencies based on input by an administrator of the IHS specifying at least one of: a noise preference and a performance preference.

6. The method of claim 5, wherein the input by the administrator specifies a preference for maximum turbo performance of the first processor.

7. The method of claim 6, wherein the input specifying a preference for maximum turbo performance results in selection of the first threshold for the rate of increase in the supported turbo frequencies of approximately 1 MHz per degree of cooling below the specification temperature of the first processor.

8. An IHS (Information Handling System) comprising:
   a first processor;
   a plurality of cooling fans;
   an airflow controller comprising a memory device having instructions stored thereon that, upon execution by a logic unit, cause the airflow controller to:
      measure a turbo frequency supported by the first processor at each of a series of temperature margins that are progressively lower than a specification temperature of the first processor;
      determine a rate of increase in the measured turbo frequencies at each of the temperature margins of the series;
      identify a first temperature margin of the series at which the rate of increase in the supported turbo frequencies falls below a first threshold; and
      utilize the first temperature margin in providing airflow cooling to the first processor using the plurality of cooling fans.

9. The IHS of claim 8, wherein the specification temperature comprises a maximum operating temperature of the first processor.

10. The IHS of claim 8, wherein the first threshold comprises an increase in the supported turbo frequencies per degree of cooling below the specification temperature of the first processor.

11. The IHS of claim 8, wherein the first processor supports increasingly higher turbo frequencies when cooled below the specification temperature and wherein the first processor supports increasingly lower turbo frequencies when cooled below a lower threshold temperature.

12. The IHS of claim 8, wherein the memory device further includes instructions that, upon execution by the logic unit, cause the airflow controller to:
   select the first threshold for the rate of increase in the supported turbo frequencies based on input by an administrator of the IHS specifying at least one of: a noise preference and a performance preference.

13. The IHS of claim 12, wherein the input by the administrator specifies a preference for maximum turbo performance of the first processor.

14. The IHS of claim 13, wherein the input specifying a preference for maximum turbo performance results in selection of the first threshold for the rate of increase in the supported turbo frequencies of approximately 1 MHz per degree of cooling below the specification temperature of the first processor.

15. A computer-readable storage device having instructions stored thereon for providing airflow cooling via a plurality of cooling fans in an IHS (Information Handling System) comprising a first processor, wherein execution of the instructions by the one or more processors, cause the one or more processors to:
   measure a turbo frequency supported by the first processor at each of a series of temperature margins that are progressively lower than a specification temperature of the first processor;
   determine a rate of increase in the measured turbo frequencies at each of the temperature margins of the series;
   identify a first temperature margin of the series at which the rate of change in the supported turbo frequencies falls below a first threshold; and
   utilize the first temperature margin in providing airflow cooling to the first processor using the plurality of cooling fans.

16. The storage device of claim 15, wherein the specification temperature comprises a maximum operating temperature of the first processor.

17. The storage device of claim 15, wherein the first threshold comprises a change in the supported turbo frequencies per degree of cooling below the specification temperature of the first processor.

18. The storage device of claim 15, wherein the first processor supports increasingly higher turbo frequencies when cooled below the specification temperature and wherein the first processor supports increasingly lower turbo frequencies when cooled below a lower threshold temperature.

19. The storage device of claim 15, wherein the storage device further includes instructions that, upon execution, cause the first processor to:
   select the first threshold for the rate of change in the supported turbo frequencies based on input by an administrator of the IHS specifying at least one of: a noise preference and a performance preference.

20. The storage device of claim 19, wherein the input by the administrator specifies a preference for maximum turbo performance of the first processor.

* * * * *